(12) United States Patent
Gusi

(10) Patent No.: US 9,813,058 B2
(45) Date of Patent: Nov. 7, 2017

(54) CONTROL UNIT FOR CONTROLLING ELECTRICAL APPARATUS

(71) Applicant: VIMAR S.P.A., Marostica (VI) (IT)

(72) Inventor: Piero Camillo Gusi, Marostica (IT)

(73) Assignee: VIMAR S.P.A., Marostica (IT)

( * ) Notice: Subject to any disclaimer, the term of this patent is extended or adjusted under 35 U.S.C. 154(b) by 55 days.

(21) Appl. No.: 14/893,254

(22) PCT Filed: May 23, 2014

(86) PCT No.: PCT/IB2014/061661
§ 371 (c)(1),
(2) Date: Nov. 23, 2015

(87) PCT Pub. No.: WO2014/188388
PCT Pub. Date: Nov. 27, 2014

(65) Prior Publication Data
US 2016/0126952 A1     May 5, 2016

(30) Foreign Application Priority Data
May 24, 2013   (IT) .............................. PD2013A0147

(51) Int. Cl.
*H03K 17/96*     (2006.01)
*H01H 9/22*      (2006.01)
(Continued)

(52) U.S. Cl.
CPC ....... *H03K 17/9622* (2013.01); *G06F 1/3231* (2013.01); *G06F 3/0202* (2013.01);
(Continued)

(58) Field of Classification Search
CPC ............. H03K 17/9622; H03K 17/962; H03K 2017/9606; G06F 3/02; G06F 3/0202;
(Continued)

(56) References Cited

U.S. PATENT DOCUMENTS 5,430,262 A * 7/1995 Matsui ................ H01H 25/041
                                                    200/11 R
6,140,987 A   10/2000 Stein et al.
(Continued)

FOREIGN PATENT DOCUMENTS

DE   202007004164   7/2008
DE   102010024776   12/2011
(Continued)

OTHER PUBLICATIONS

International Search Report for PCT/IB2014/061661 dated Sep. 16, 2014.
(Continued)

*Primary Examiner* — Felix O Figueroa
(74) *Attorney, Agent, or Firm* — Stradley Ronon Stevens & Young, LLP

(57) ABSTRACT

A control unit for controlling electrical apparatus. The control unit has (i) a control device which may be wall-mounted; (ii) an actuation plate which may be secured to the control device and comprises a cover surface which is at least partially transparent; (iii) a sensor member for detecting when a user's finger or another body comes into contact with a touch zone; and (iv) a control designed to control the electrical apparatus according to a specific function following detection of the contact action. The control device comprises a switching device associated with the touch zone through the control in such a way that the actuation of the switching device controls the electrical apparatus according to the same function associated with the touch zone.

14 Claims, 7 Drawing Sheets

(51) Int. Cl.
*G06F 1/32* (2006.01)
*G06F 3/02* (2006.01)
*H03K 17/955* (2006.01)
*H01R 9/24* (2006.01)
*H01H 9/28* (2006.01)

(52) U.S. Cl.
CPC ............... *H01H 9/22* (2013.01); *H01R 9/24* (2013.01); *H03K 17/955* (2013.01); *H03K 17/962* (2013.01); *H01H 9/287* (2013.01); *H01H 2221/03* (2013.01); *H01H 2221/068* (2013.01); *H03K 2217/960755* (2013.01); *Y02B 60/1289* (2013.01)

(58) Field of Classification Search
CPC ...... H01H 9/22; H01H 9/287; H01H 2221/03; H01H 2221/068
USPC .................................... 200/600, 43.18–43.22
See application file for complete search history.

(56) References Cited

U.S. PATENT DOCUMENTS

| | | | |
|---|---|---|---|
| 6,396,007 | B1 | 5/2002 | Vicktorius |
| 7,026,566 | B2 * | 4/2006 | Chyc ................ H01H 13/705 200/5 A |
| 7,499,040 | B2 * | 3/2009 | Zadesky ............. G06F 3/0338 345/173 |
| 7,829,812 | B2 * | 11/2010 | Tolbert ............... H01H 13/702 200/5 A |
| 7,829,813 | B2 * | 11/2010 | Murase ................ H01H 13/70 200/517 |
| 2007/0146348 | A1 | 6/2007 | Villain |
| 2010/0182167 | A1 | 7/2010 | Vanhelle et al. |

FOREIGN PATENT DOCUMENTS

| | | |
|---|---|---|
| EP | 1691263 | 8/2006 |
| GB | 2470423 | 11/2010 |
| WO | 2005/019987 | 3/2005 |
| WO | 2010/131155 | 11/2010 |
| WO | 2012/137876 | 10/2012 |

OTHER PUBLICATIONS

"Zennio Touch-MyDesign. KNX Capacitive Touch Switch ZN1VI-TPTMD4, ZN1VI-TPTMD6, ZN1VI-TPTMD8. Technical Documentation" dated May 2, 2013.
"Zennio Touch-MyDesign KNX Capacitive Touch Switch—6 Buttons" dated May 2, 2013.
International Search Report for PCT/IB2014/061656 dated Sep. 16, 2014.

* cited by examiner

CONTROL UNIT FOR CONTROLLING ELECTRICAL APPARATUS

RELATED APPLICATIONS

The present application is a U.S. national phase application of International Application No. PCT/IB2014/061661 filed on May 23, 2014, which claims the benefit of priority to Italian Patent Application Number PD2013A000147, filed on May 24, 2013, the contents of which are incorporated in this application by reference.

TECHNICAL FIELD

The invention relates to a control unit for electrical apparatus, of the type comprising a control device which may be wall-mounted and an actuation plate which may be secured thereto.

BACKGROUND OF THE INVENTION

It is known in the reference sector to use switches and other types of controls for electrical apparatus which may be wall-mounted.

These switches are typically used in electrical apparatus, which may be domestic or industrial, in order to control lights or other appliances, such as electric blinds, or to open (and close) doors and gates.

The switch is provided with a terminal block to which the electrical cables connected to the apparatus to be controlled are connected and is wall-mounted using an appropriate support, normally box-shaped, secured in a fixed manner to the wall.

In a first type of switch, the apparatus is actuated in an electromechanical manner by acting on a push button which may move between a first position in which an electrical contact is closed and a second position in which the contact is open.

As an alternative to electromechanical switches, control devices are also known which use a contact sensor which, through an appropriate electronic circuit, controls the apparatus in order, for instance, to turn it on or off by touching a specific part of an external contact surface of the device.

The external surface may contain different touch zones, each associated with a specific function of the control device. There may, for instance, be two zones, one above the other, which make it possible to turn a light on or off, reflecting the way in which electromechanical switches are operated.

The external surface is thus made from transparent material, so as to enable the display of graphical symbols disposed below the contact surface which make it possible to identify the specific function associated with contact with the surface portion lying above the symbol.

A plate is typically used in electromechanical switches and is usually shaped as a frame which covers the support and enables it to be fastened to the wall. An electromechanical device is disclosed, for example, in DE 20 2007 004164.

The plate also makes it possible to provide switches with high-quality aesthetic characteristics.

For that reason as well, the plates are secured in a detachable manner to the support so that installation operations may be carried out before they are fitted and so that they can be removed during any operations to maintain the switch or the room in which it is installed.

It is, for instance, very useful to be able to remove the plate when the wall on which the switch is fixed is being painted.

In that respect, it will be appreciated that the removal of the plate is not detrimental to the operation of the control device as it does not perform any operational function.

Some types of contact control devices also comprise a detachable plate but, in such cases, the operation of the device is compromised following the removal of the plate.

The electrical apparatus is in practice controlled by contact with the external surface of the plate itself, and, as a result, the electrical apparatus may continue to operate during the installation and maintenance operations described above.

The technical problem underlying the present invention is one of providing a control device which may be wall-mounted for the control of electrical apparatus which is structurally and functionally designed to remedy all the drawbacks discussed with respect to the cited prior art.

SUMMARY OF THE INVENTION

This problem is resolved by a control unit for controlling electrical apparatus according to the present invention. In one embodiment, the control unit for controlling an electrical apparatus has a control device which may be wall-mounted and an actuation plate which may be removably secured to the control device. The actuation plate comprises a cover surface which is at least partially transparent, the cover surface being disposed, in use, to cover the control unit and a portion of a wall on which the control device is mounted. The control unit also has a sensor member for detecting when a user's finger or another body comes into contact with a touch zone, and a control adapted to control the electrical apparatus according to a specific function following detection of the contact action. The control device comprises a switching device associated with the touch zone through the control in such a way that the actuation of the switching device controls the electrical apparatus according to the same function associated with the touch zone, the switching device being covered by the actuation plate when it is secured to the control device.

The present invention makes it possible to control an electrical apparatus even following the removal of the actuation plate onto which the touch zone is defined and which is touched in order to control the apparatus during the normal operation of the control unit. In this manner, during installation or maintenance, when the plate is not present or is removed, it is still possible to perform the same control functions associated with the apparatus when provided with the plate and it is used in touch-mode.

BRIEF DESCRIPTION OF THE DRAWING

The features and further advantages of the invention will become clear from the following detailed description of a preferred but not exclusive embodiment thereof, shown by way of non-limiting example in the appended drawings, in which.

DETAILED DESCRIPTION OF THE INVENTION

Figure 1:
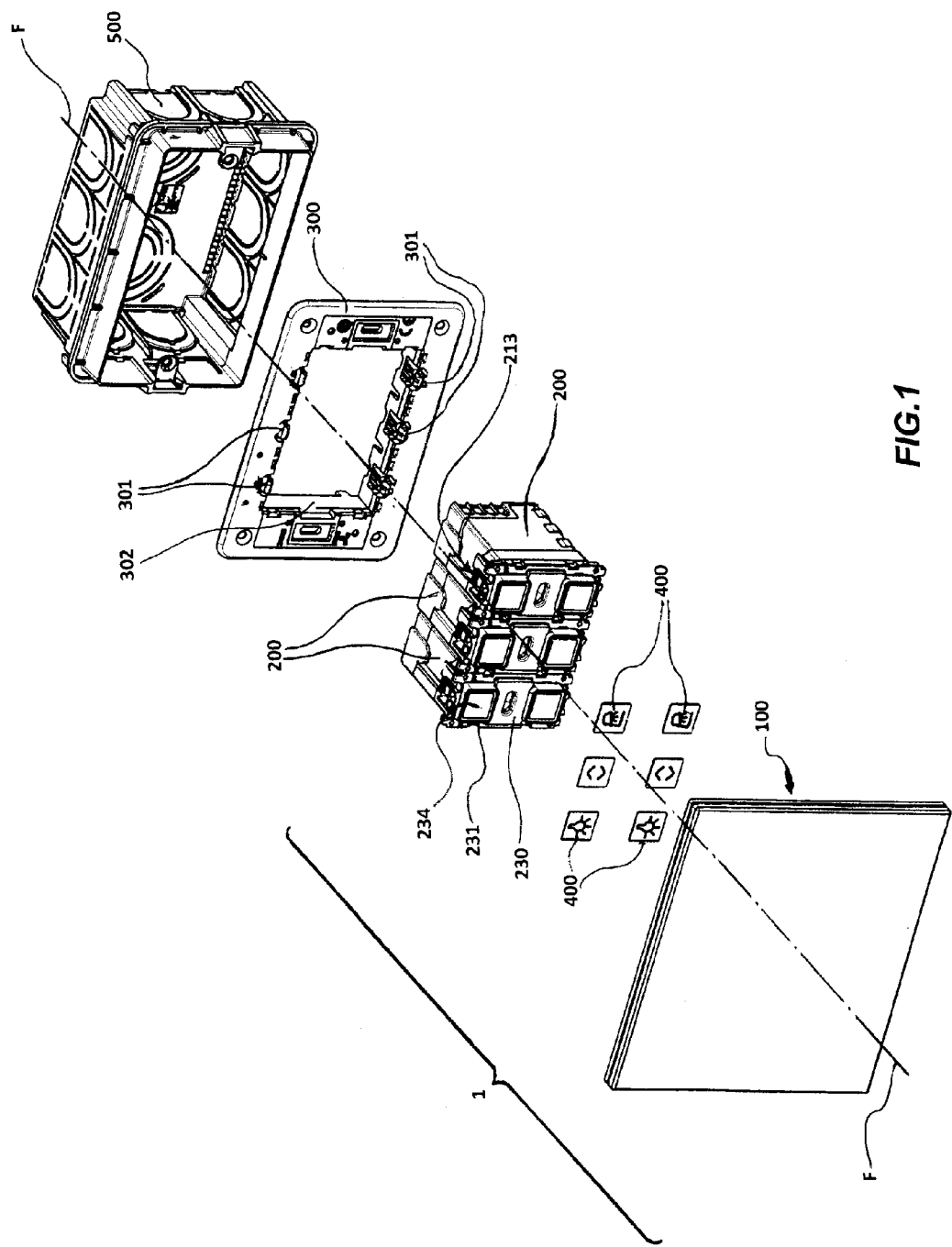
FIG. 1 is an exploded perspective view of a control unit of the present invention associated with a related fastening frame.

With reference first to FIG. 1, a control unit for an electrical apparatus, of the type which may be wall-mounted, is shown overall by reference numeral 1.

The control unit 1 comprises one or a plurality of control devices 200 and an actuation plate 100 which may be secured to the control device 200 by methods which will be described in further detail below.

The control unit 1 is preferably fastened to the wall by a fastening frame 300, for instance of a type similar to those used in switches embodied in accordance with the prior art, typically in conjunction with a box-shaped body 500.

In order to install the control unit 1, the box-shaped body 500 is secured in a permanent manner in a cavity in the wall, for instance by mortar or other appropriate building materials.

The fastening frame 300 is then connected, advantageously in a detachable manner, for instance by a threaded connection, to the box-shaped body 500, thereby defining a seat for housing the control device 200.

According to a preferred embodiment, a snap-locking connection is provided between the control device 200 and the fastening frame 300 so as to enable these components to be connected by sliding the control device 200 within the fastening frame 300 in a fastening direction F.

By way of example, the snap-locking connection may be embodied as a flexible pawl 301 (or preferably a plurality of pawls 301) disposed along an inner edge of the frame 300 which engages in a respective seat 213 provided in the control device 200.

This type of connection is advantageous in that the control unit 1 of the present invention may be modular in form, enabling the use of a series of individual modules, each defined by a respective control device 200, on a single fastening frame 300 and, as will be described in further detail below, in association with a single actuation plate 100. In the present embodiment, there are, for instance, three control devices 200 alongside one another.

The actuation plate 100 may also be secured to the control unit 200 directly or by the support frame 300, using methods which will be described below, but preferably by pressing it against the control unit 200 in the fastening direction F.

Figure 2:
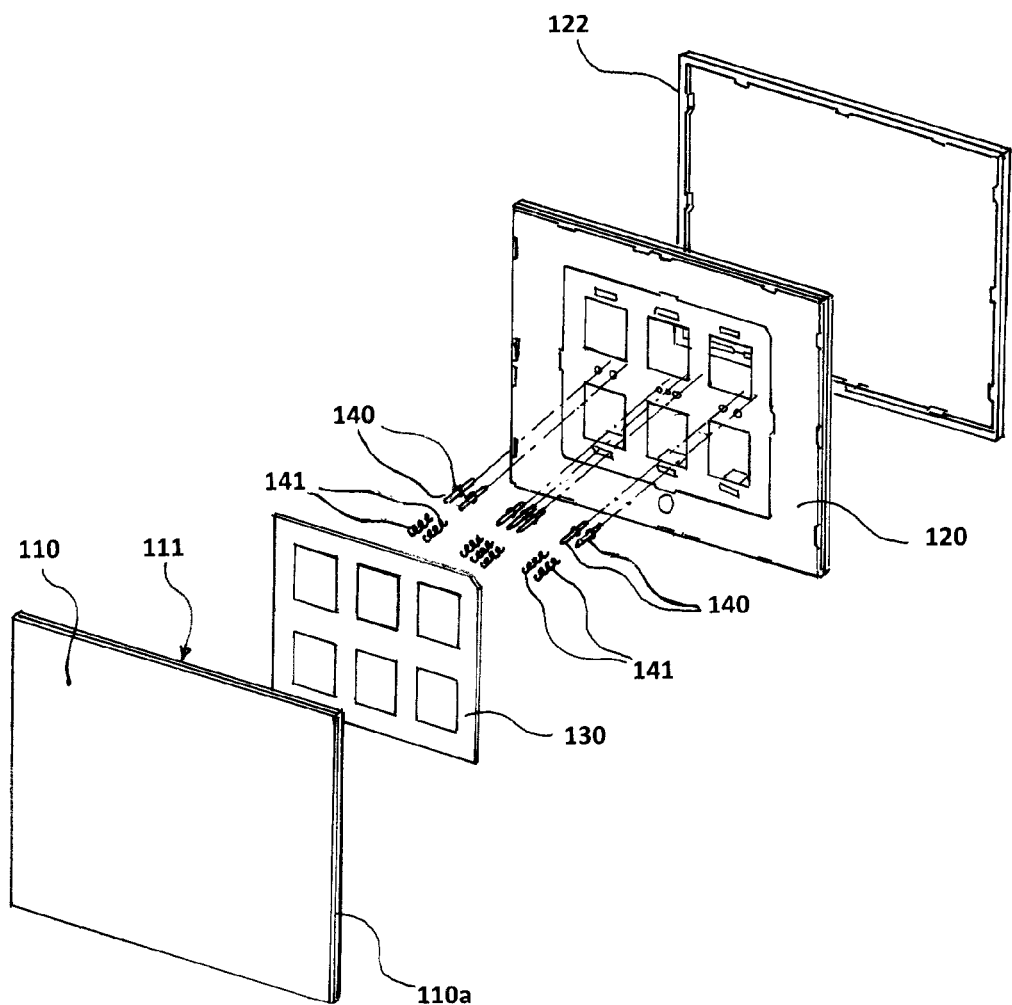
FIG. 2 is an exploded perspective view of an actuation plate of the control unit of FIG. 1.

With reference to FIG. 2 as well, the actuation plate 100 comprises a support frame 120 and a related cornice 122 to which a plate 110a which defines a cover surface 110 is secured. The plate 110a is preferably made from glass or another transparent material and has dimensions such that when the plate 110a is secured to the control unit 200, the cover surface 110 is disposed to cover the control unit 200 and a portion of the wall surrounding the control device 200 and the related fastening frame 300.

The plate 110a, although made from transparent material, preferably has an opaque coating which enables light to pass through at least partially, for reasons that will be explained below, but nevertheless conceals the details of the components lying below the plate 110a from sight. This effect may be obtained, for instance, by a silk-screen technique.

A sensor member 130 able to detect contact between a user's finger and the cover surface 110 is further provided between the plate 110a and the support frame 120.

The sensor member 130 preferably comprises capacitor members such that contact by a finger or other mechanism is detected by a variation of electrical capacitance of the capacitor members that takes place when the cover surface 110 is touched.

It will nevertheless be appreciated that use may be made of different types of sensor members 130 which are able to supply a signal detecting a contact action at a specific position of the cover surface 110.

In addition, the actuation plate 100 comprises an electrical connection designed to provide an electrical connection between the actuation plate 100 and the control device 200.

According to a preferred embodiment, the electrical connection comprises an electrical connector 140, preferably in the form of a pin, housed in a sliding manner in a seat 124 defined in the support frame 120.

The seat 124 extends longitudinally in parallel with the fastening direction F in such a way as to enable the electrical connector 140 to be moved in that direction.

Figure 4:
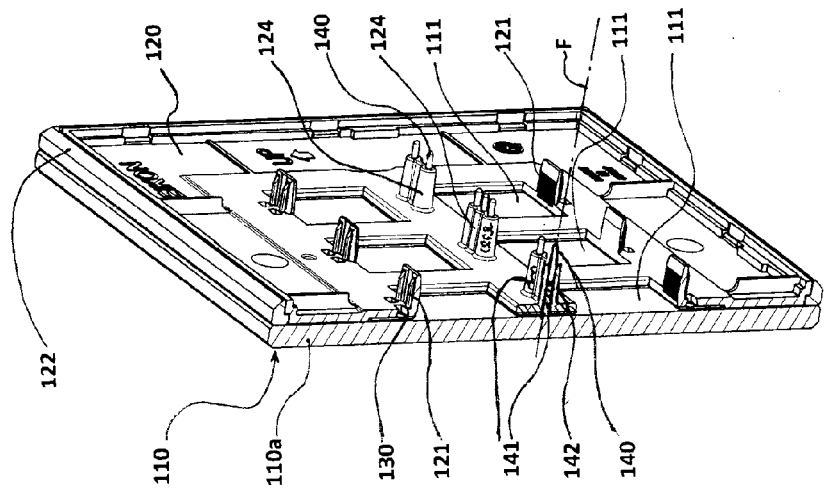
FIG. 4 is a rear perspective view of a detail of the actuation plate of FIG. 2.

As can be seen from FIG. 4, the pin 140 forming the electrical connector advantageously has a shoulder 142 which makes it possible to lock a helical spring 141 and to define an end of stroke for the pin 140, retaining it within the corresponding seat 124.

The helical spring 141, or other equivalent resilient mechanism, makes it possible to oppose the displacement of the pin 140 towards the interior of the seat 124, forcing it towards its position of maximum extension. The spring 141 is of electrically conducting material and is disposed to bear on the sensor member 130 so as to connect it electrically to the control device 200.

Figure 5:
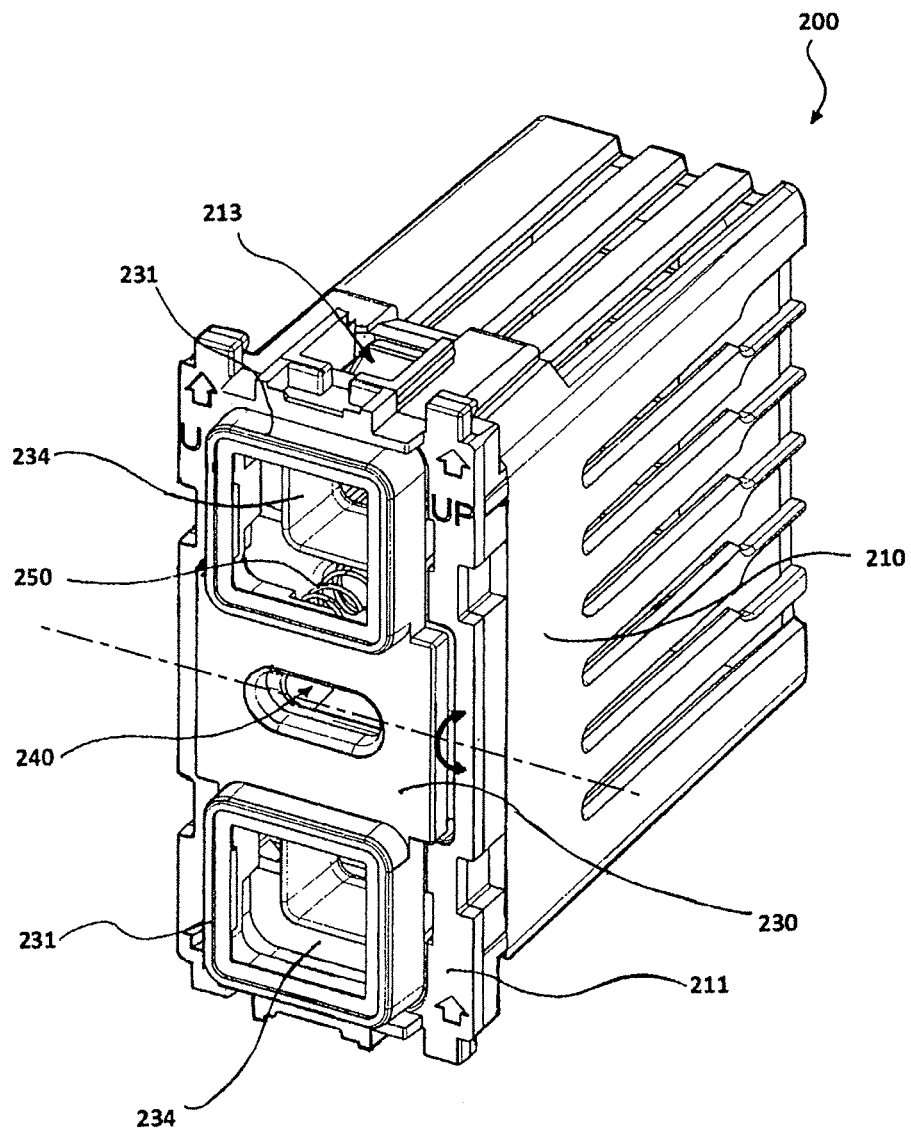
FIGS. 5 and 5A are a perspective view and a corresponding exploded view of a control device forming part of the control unit of FIG. 1.
Figure 5A:
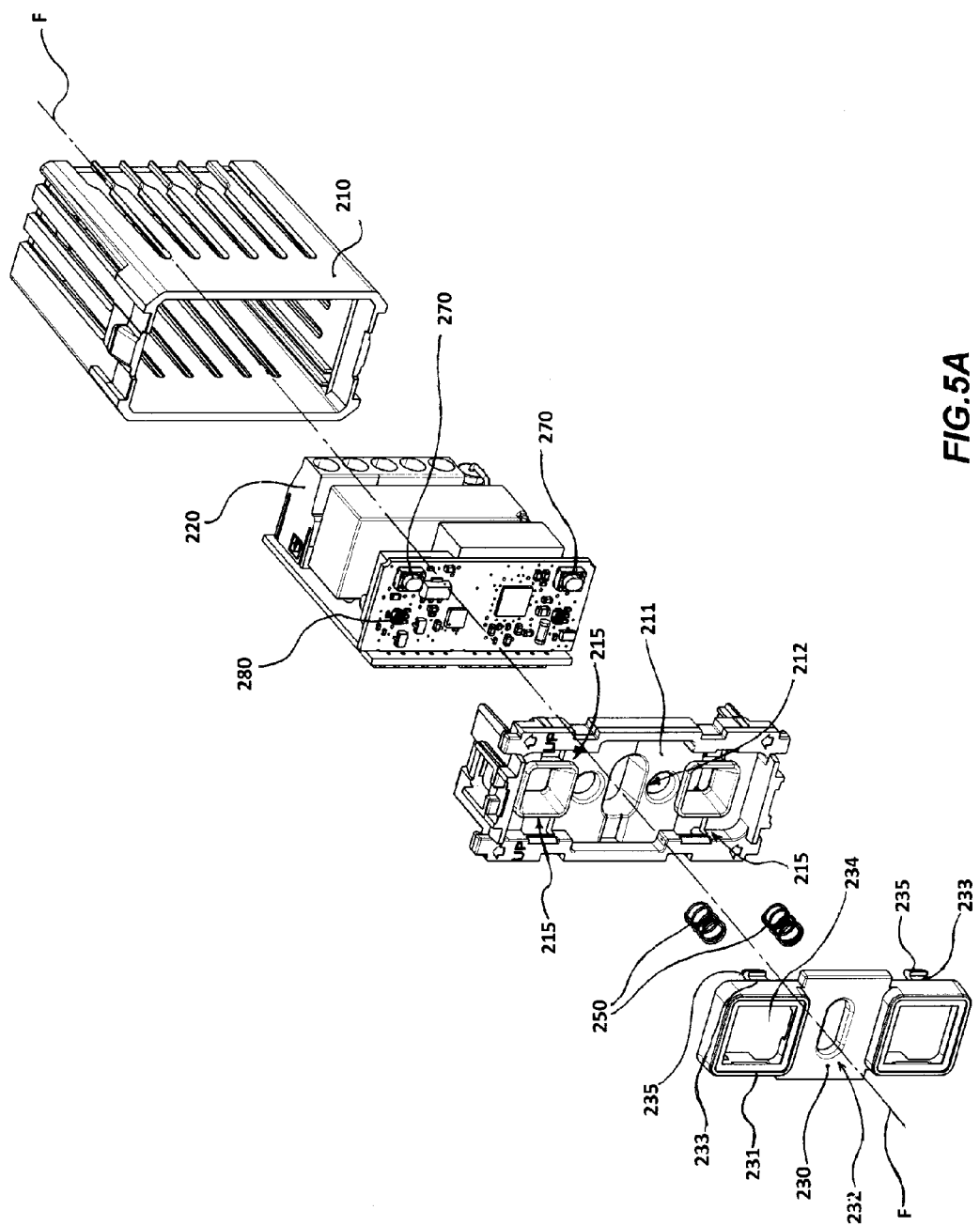

With reference to FIGS. 5 and 5A, the control device 200 comprises a base structure 210 which defines a housing within which a control 280, formed for instance by an electronic circuit board, is housed and is designed to process a signal supplied by the sensor member 130 and a terminal block 220 for the electrical connection with the apparatus to be controlled.

Figure 6:
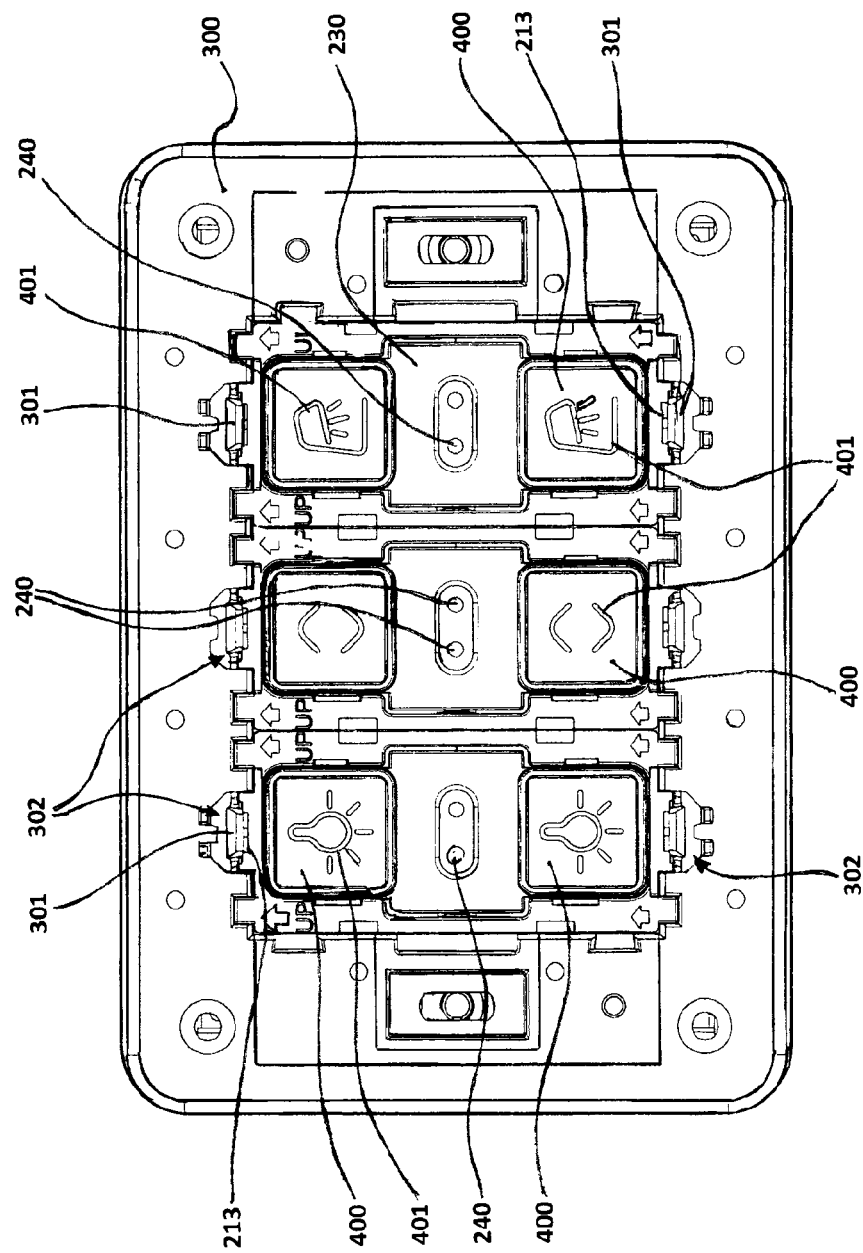
FIG. 6 is a front view of the control unit of the present invention secured to the related fastening frame with the actuation plate removed.

The base structure 210 preferably comprises a front body 211 in which an opening 212 is provided for the passage of the pin 140 so as to enable contact between the latter and a conducting surface 240 of the control device 200, as shown in FIG. 6.

The contact between the pin 140 and the conducting surface 240 makes it possible to supply electrical power to the actuation plate 100 and to transmit a signal designed to detect a contact action supplied by the sensor member 130.

The control device 200 further comprises an abutment member 230 which may also move in the fastening direction F with respect to the base structure 210. A pair of edges 231 which extend in a direction away from the base structure 210 are defined on the abutment member 230.

Figure 7A:
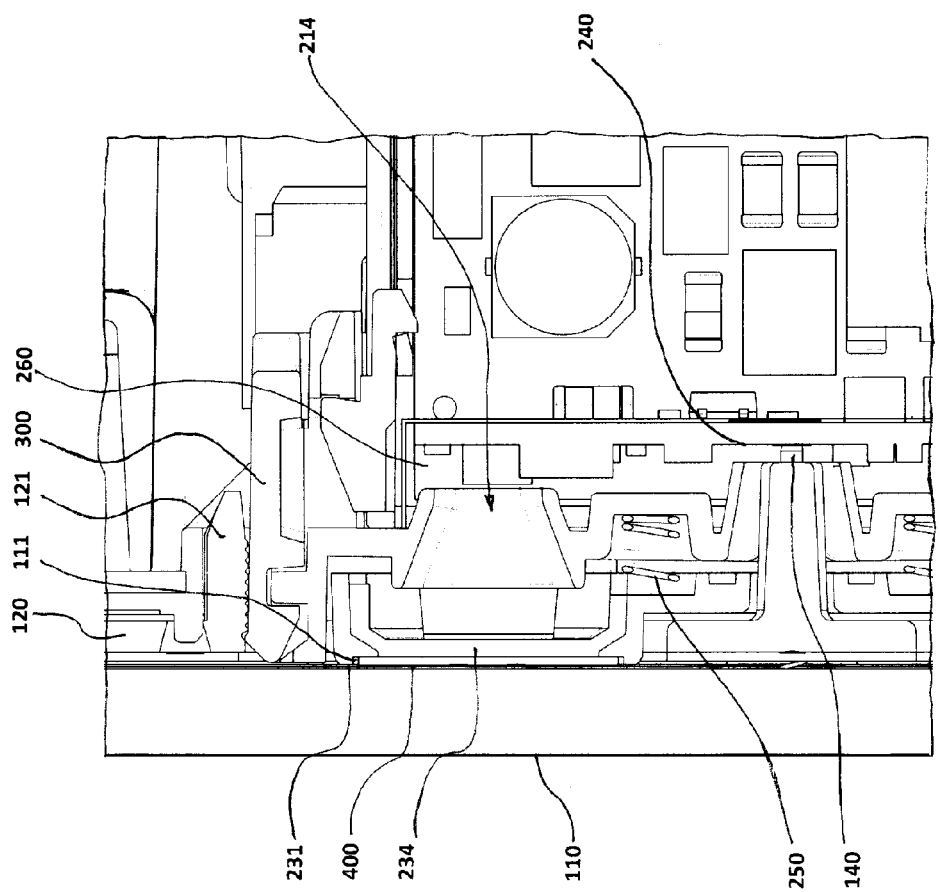
FIGS. 7 and 7A are respectively a view in lateral section and a related detail of the control unit of the present invention.
Figure 7:
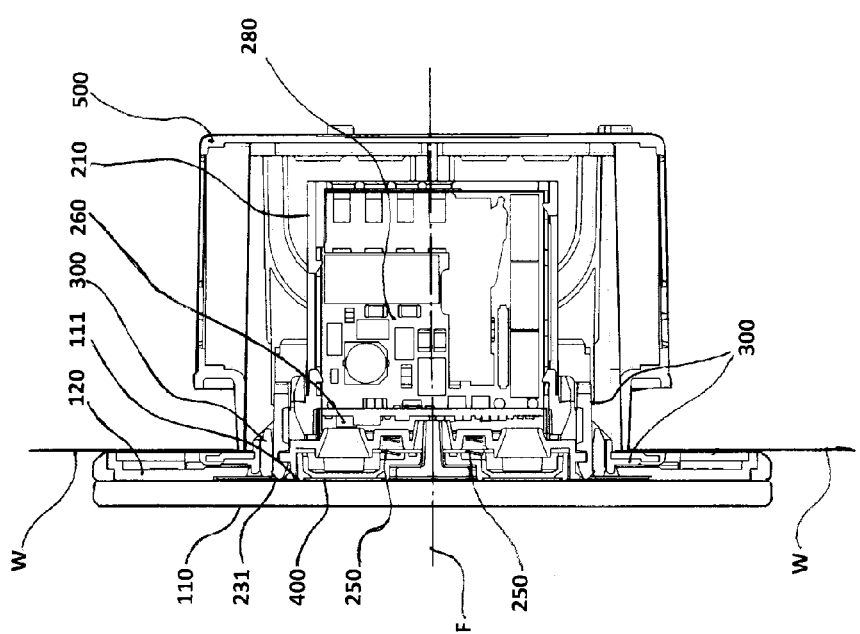

These edges 231 are designed to abut on an inner surface 111 of the actuation plate 100 opposite the cover surface 110, as shown in FIGS. 7 and 7A.

Again with reference to FIG. 5A, the abutment member 230 is preferably secured in a sliding manner to the front body 211 which, to that end, comprises a plurality of through cavities 215 within which an elongate extension 233 of the abutment member 230 is housed in a sliding manner.

The elongate extension 233 advantageously has a widened end 235 which has an end of stroke function. The widened end 235 is also preferably wedge shaped so that it can be inserted in the relative through cavity 215 following a slight deformation of the material and make it possible at the same time to provide the end of stroke function described above.

According to a preferred embodiment, the elongate extensions 233 are housed in the respective cavities 215 with sufficient play not only to enable a movement in translation in the fastening direction F, but also to enable at least minimal movements in rotation of the abutment member 230 about the two axes perpendicular to the fastening direction F or, as an alternative, about at least one of these axes. It will nevertheless be appreciated that similar movement possibilities may be also achieved by different couplings with play.

In order to oppose the displacement of the abutment member 230 in the fastening direction F or its rotation about the above-mentioned axes, the control device 200 further comprises a second resilient mechanism embodied, in the present embodiment, by a pair of helical springs 250.

The abutment member 230 also has an opening 232, facing the opening 212 provided in the front body 211 in order to enable the passage of the pins 140 and their contact with the respective conducting surface 240.

Figure 3A:
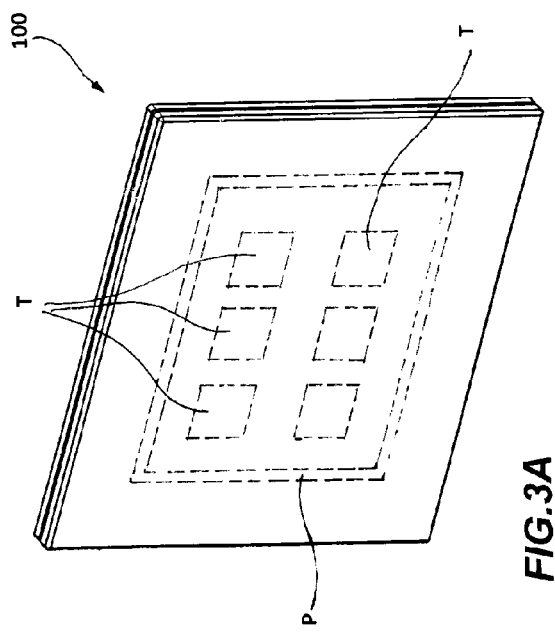
FIGS. 3A and 3B are respectively a perspective view and a lateral view of the actuation plate of FIG. 2.
Figure 3B:
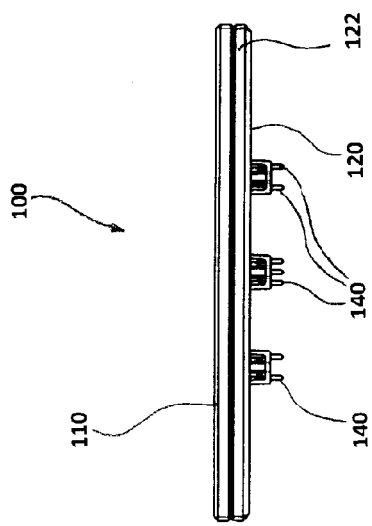

It should also be noted that when the actuation plate 100 is secured to the control device 200, the edges 231 are located at respective touch zones T of the cover surface 110 shown diagrammatically in FIG. 3A. The sensor member 130 and the related control 280 are thus embodied such that each touch zone T corresponds to a different control function of an electrical apparatus to which the control 280 is connected. A first touch zone T may, for instance, be provided such that when it is touched the apparatus is turned on, and when a second touch zone T is touched, it is turned off. In addition, contact with the touch zones T may also be associated with functions other than the simple turning on or off of apparatus, for instance a prolonged touch may vary the light intensity of a lamp.

In order to identify the touch zones T, the control device 200 further comprises a lighting device 260, shown diagrammatically in FIG. 7A and embodied by way of example as an LED.

The light projected by the lighting device 260 is projected towards the inner surface 111 of the actuation plate 100 via a passage 214 of frustoconical shape defined in the front body 211 and a transparent surface 234 of the abutment member 230 whose perimeter corresponds with the edge 231.

The transparent surface 234 is associated with a graphical symbol 401 which may be advantageously formed by an appropriately shaped support portion 400, preferably adhesive, or also partially transparent itself, secured to the transparent surface 234. The support surface 400 is advantageously opaque and a cut or transparent window is provided in it and is shaped in accordance with the graphical symbol 401. In this way, a light image of the graphical symbol 401 is projected onto the cover surface 110 of the actuation plate 100, advantageously at a touch zone T, making it possible to identify the function associated with that specific touch zone. As mentioned above, the plate 110a is coated so as to enable the passage of the light emitted by the lighting device 260, without, however, making the other components lying below the actuation plate 100 visible. This feature makes it possible to provide the control unit 1 with optimum aesthetic characteristics.

According to a preferred embodiment, the lighting device 260 is advantageously associated with a proximity sensor device which turns it on when a finger—or another operating mechanism—is detected in the vicinity of the cover surface 110.

Advantageously, the proximity sensor may be formed by the sensor member 130 itself, for instance by defining one or a plurality of proximity zones P, disposed for instance around the perimeter of the touch zone T, which are more sensitive than the touch zones T. In this way, the surface capacitance variation which takes place following the presence of a finger may be detected by the proximity zone P without actual contact with the cover surface 110.

It should be noted in this respect that, although the contact action may be detected when the cover surface 110 is almost touched, and the finger is therefore brought to a minimal distance from it without actually touching it, the distance from which the proximity sensor is able to detect the presence of a finger is much greater than that of the contact sensor and preferably differs by at least an order of magnitude. By way of example, when it is possible to detect the contact action even when the cover surface 110 is almost touched, a maximum working distance of the contact sensor may be a few millimeters, while, in contrast, the maximum working distance of the proximity sensor may, by way of example, be 10-15 cm.

This feature may for instance be obtained by providing capacitor members able to detect the proximity of a finger whose dimensions are greater than those used for detecting the contact action, so as to associate the latter with a greater electrical capacitance variation at the same distance of the finger, which can therefore be detected at the distances mentioned above.

As a result of this feature, it is therefore possible to activate or intensify the back-lighting produced by the lighting device 260 in such a way as to guide users as they move closer to the touch zones T which may be readily distinguished. To that end, it may be further provided that in the control unit 1 of the present invention, only active touch zones T are lit, i.e., zones which, when touched, actually cause a variation in the state of the apparatus to be controlled. By way of example, when the control unit 1 is used to control apparatus for lighting an environment, a touch zone T for turning on the light and a touch zone T for turning it off may be provided. These zones are typically disposed one above the other and the above-described function advantageously makes it possible solely to show the active zone (i.e., the zone corresponding to the light being on when it is turned off and vice-versa).

According to a preferred embodiment, the lighting device 260, once turned on or intensified following detection of the proximity of a finger or other mechanism, returns to the previous state—turned off or at a reduced light intensity—after a certain time interval. It will be appreciated that this feature makes it possible to save energy and to avoid the presence of a source of light which the user may, in various situations, find annoying.

Again with reference to FIG. 5A, the control device 200 of the present invention comprises a switching device 270 associated with the touch zone T by the control 280. It will be appreciated that the switching device 270 is disposed on the control device 200 in such a way that it is covered by the actuation plate 100 when it is secured to the control device 200. The switching device 270 may be accessed by the user, however, when the actuation plate 100 is removed.

Advantageously, the switching device 270 controls the electrical apparatus according to the same function associated with a specific touch zone T. To that end, the control device 200 comprises a respective switching device 270 associated with each touch zone T contained in the actuation plate 100.

According to a preferred embodiment, the switching device 270 is formed by a switch which is actuated by displacing the abutment member 230 beyond a predetermined distance in the fastening direction F. By "predetermined" is meant determined beforehand, so that the predetermined distance must be determined, i.e., chosen or at least known, before the abutment member 230 is displaced.

In other words, from the position at which the abutment member 230 is furthest from the front body 211, the abutment member 230 is free to move a certain distance in the fastening direction F without touching the switch 270. Once in contact with the switch 270, a further displacement of the abutment member 230 causes it to be actuated. According to a preferred embodiment, the switch 270 is pressed by the widened ends 235 of the extensions 233. In that respect, it will be appreciated that the coupling with play of the extensions 233 in the through cavities 215 also makes it possible for the abutment member 230 to move in rotation about the two axes perpendicular to the fastening direction F and in particular about a horizontal axis, and advantageously makes it possible for the abutment member 230 to control the switches, of which there are two, individually.

Each switch 270 is thus connected to the control 280 and is operationally associated with a respective touch zone T so that the actuation of the switch 270 produces the same function as is associated with contact with the respective zone T.

This feature advantageously makes it possible to be able to control the electrical apparatus by the control unit 1 even when the actuation plate 100 is not fitted, for instance during installation or maintenance of a plant or in particular situations in which the actuation plate 100, visible when the control unit 1 is operating normally, could become dirty or broken.

The operation of the control unit 1 of the present invention is shown diagrammatically in FIGS. 7 and 7A.

As illustrated above, installation of the control unit 1 takes place using the fastening frame 300 on which the control device 200 is secured by a snap-locking connection.

Typically, the fastening frame 300 is in turn secured on the box-shaped body 500, inserted into the wall W, for instance by a threaded connection.

Any positioning errors of the box-shaped body 500, in particular in terms of alignment with the wall W are also transmitted to the fastening frame 300 and, in turn, to the control device 200.

Once the control device 200 is fitted, the actuation plate 100 is secured thereto, preferably using a plurality of arms 121 which extend from the support frame 120 in the fastening direction F and may be engaged in corresponding seats 302 provided on the fastening frame 300 and illustrated in FIG. 6.

The arms 121 have a surface provided with a plurality of recesses in which a pawl (not shown) projecting from the seat 302 may be engaged.

In this way, the arms 121 may be engaged in a plurality of operating configurations spaced from one another in the fastening direction F.

Once the arms 121 are inserted in the respective seats 302, the actuation plate 100 may therefore be urged into contact with the wall W and bear thereon, covering the control device 200, the fastening frame 300 and a wall portion extending around its perimeter.

It will be appreciated that the abutment member 230 and the control device 200 are dimensioned such that when the latter is secured to the wall W, the edges 231 project at least partially from the surface of the wall W.

In this way, when the actuation plate 100 is fitted, the edges 231 abut on the inner surface 111 and are recalled towards the front body 211 in opposition to the resilient springs 250.

As a result of the movement capacity offered by the abutment member 230 with respect to the base structure 210 of the control device 200, the edges 231 may abut on the inner surface 111 even in the event of installation errors or irregularities in the surface of the wall W.

This feature makes it possible to ensure contact between the edges 231 and the inner surface 111 thus ensuring that a clear image is projected onto the cover surface 110.

A similar compensation effect is also provided by the electrical connector 140 which is appropriately recalled into the relative seat after the actuation plate 100 has been secured on the control device 200.

The invention thus resolves the stated problem and at the same time provides a number of advantages. In particular, the structure of the control unit 1 of the present invention enables simple personalisation of the graphical symbol 401, requiring for that purpose only the replacement of the control device 200 or, more advantageously, solely of the adhesive portion on which the graphical symbol 401 is shown.

Moreover, the movement capacity of the abutment member 230, which makes it possible to keep an edge of the member in abutment on the inner surface 111 even in the event of installation errors or irregularities, advantageously enables a clear and sharp projection of the graphical symbol 401 onto the cover surface 110.

In addition, a correct electrical contact between the actuation plate 100 and the control device 200 is readily ensured through the compensation capacity of the electrical connection of the control unit 1 of the present invention. In this way, a rapid and correct assembly of the device may be ensured at the installation stage, helping therefore to enable its personalization.

Moreover, the use of the moving electrical connector, able to abut on the relative conducting surface makes it possible, with respect to other electrical connections, to compensate for any errors in the centring of the actuation plate 100 via a solution whose dimensions are particularly compact.

A further advantage lies in the possibility of actuating the lighting device 260 and at the same time displaying the graphical symbols 401 following only the presence of a finger in the proximity of the actuation plate 100 with a consequent energy saving and less of a visual impact for the user.

Lastly, the control unit 1 of the present invention may advantageously also be actuated without the actuation plate 100, which is a particularly desirable feature during operations to maintain the electrical plant or the building in which it is installed.

The invention claimed is:

1. A control unit for controlling an electrical apparatus, the control unit comprising:
   a control device adapted to be mounted on a wall;
   a rigid actuation plate removably secured to the control device and including a cover surface which is at least partially transparent, the cover surface being disposed, in use, to cover the control unit and a portion of the wall on which the control device is mounted;

a sensor member for detecting when a user's finger or another body comes into contact with a touch zone; and
a control for controlling the electrical apparatus according to a specific function following detection of a contact of the user's finger or another body with the touch zone, wherein the control device has a switching device associated with the touch zone through the control in such a way that actuation of the switching device controls the electrical apparatus according to the same specific function associated with the touch zone, the switching device being covered by the actuation plate when the actuation plate is secured to the control device such that actuation of the switching device is prevented, the switching device being accessible by the user only when the actuation plate is removed.

2. The control unit according to claim 1, wherein the control device has a base structure and an abutment member including an edge adapted to abut on an inner surface of the actuation plate opposite the cover surface, the abutment member being connected to the base structure in such a way as to enable the edge at least to move in translation in a fastening direction of the actuation plate on the control device.

3. The control unit according to claim 2, wherein the switching device comprises a switch adapted to be actuated by moving the abutment member beyond a predetermined distance in the fastening direction.

4. The control unit according to claim 3, wherein the abutment member further includes elongate extensions which extend in the fastening direction and are adapted to actuate the switch.

5. The control unit according to claim 4, wherein the control device further has a front body to which the abutment member is secured in a sliding manner, the elongate extensions being housed with play in respective through cavities formed in the front body in such a way as to enable at least limited rotations about an axis perpendicular to the fastening direction.

6. The control unit according to claim 5, wherein the axis perpendicular to the fastening direction is, in use, substantially horizontal.

7. The control unit according to claim 2, further comprising a spring adapted to counter the displacement of the abutment member in the fastening direction.

8. The control unit according to claim 1, wherein the actuation plate is detachably secured to the control device.

9. The control unit according to claim 1, further comprising an electrical connection between the actuation plate and the control device, wherein the control device further has a base structure and a terminal block and the actuation plate further includes a support frame, the electrical connection being connected to the terminal block and including at least one electrical connector adapted to move in the fastening direction with respect to the support frame and/or with respect to the base structure.

10. A control unit for controlling an electrical apparatus, the control unit comprising:
a control device adapted to be mounted on a wall;
a rigid actuation plate removably secured to the control device and including a cover surface which is at least partially transparent, the cover surface being disposed, in use, to cover the control unit and a portion of the wall on which the control device is mounted;
a sensor member for detecting when a user's finger or another body comes into contact with a touch zone;
a control for controlling the electrical apparatus according to a specific function following detection of a contact of the user's finger or another body with the touch zone; and
a spring,
wherein the control device has (i) a switching device associated with the touch zone through the control in such a way that actuation of the switching device controls the electrical apparatus according to the same specific function associated with the touch zone, the switching device being covered by the actuation plate when the actuation plate is secured to the control device such that actuation of the switching device is prevented, the switching device being accessible by the user only when the actuation plate is removed, the switching device including a switch, (ii) a base structure, (iii) an abutment member including elongate extensions which extend in a fastening direction of the actuation plate on the control device and an edge adapted to abut on an inner surface of the actuation plate opposite the cover surface, the abutment member being connected to the base structure in such a way as to enable the edge at least to move in translation in the fastening direction, the switch being adapted to be actuated by the elongate extensions upon moving the abutment member beyond a predetermined distance in the fastening direction, and the spring being adapted to counter the displacement of the abutment member in the fastening direction, and (iv) a front body to which the abutment member is secured in a sliding manner, the elongate extensions being housed with play in respective through cavities formed in the front body in such a way as to enable at least limited rotations about an axis perpendicular to the fastening direction.

11. The control unit according to claim 10, wherein the axis perpendicular to the fastening direction is, in use, substantially horizontal.

12. The control unit according to claim 10, wherein the actuation plate is detachably secured to the control device.

13. The control unit according to claim 10, further comprising an electrical connection between the actuation plate and the control device, wherein the control device further has a base structure and a terminal block and the actuation plate further includes a support frame, the electrical connection being connected to the terminal block and including at least one electrical connector adapted to move in the fastening direction with respect to the support frame and/or with respect to the base structure.

14. A control unit for controlling an electrical apparatus, the control unit comprising:
a control device adapted to be mounted on a wall and including a base structure and a terminal block;
a rigid actuation plate removably secured to the control device and including a support frame and a cover surface which is at least partially transparent, the cover surface being disposed, in use, to cover the control unit and a portion of the wall on which the control device is mounted;
a sensor member for detecting when a user's finger or another body comes into contact with a touch zone;
a control for controlling the electrical apparatus according to a specific function following detection of a contact of the user's finger or another body with the touch zone;
an electrical connection between the actuation plate and the control device, the electrical connection being connected to the terminal block and including at least one electrical connector adapted to move with respect to the support frame and/or with respect to the base structure in a fastening direction of the actuation plate on the control device; and a spring, wherein the control device has (i) a switching device associated with the touch zone through the control in such a way that actuation of the switching device controls the electrical apparatus according to the same specific function associated with the touch zone, the switching device being covered by the actuation plate when the actuation plate is secured to the control device such that actuation of the switching device is prevented, the switching device being accessible by the user only when the actuation plate is removed, the switching device including a switch, (ii) an abutment member including elongate extensions which extend in the fastening direction and an edge adapted to abut on an inner surface of the actuation plate opposite the cover surface, the abutment member being connected to the base structure in such a way as to enable the edge at least to move in translation in the fastening direction, the switch being adapted to be actuated by the elongate extensions upon moving the abutment member beyond a predetermined distance in the fastening direction, and the spring being adapted to counter the displacement of the abutment member in the fastening direction, and (iii) a front body to which the abutment member is secured in a sliding manner, the elongate extensions being housed with play in respective through cavities formed in the front body in such a way as to enable at least limited rotations about an axis perpendicular to the fastening direction which axis is, in use, substantially horizontal.

* * * * *